US008592106B2

(12) United States Patent
Tanabe

(10) Patent No.: US 8,592,106 B2
(45) Date of Patent: *Nov. 26, 2013

(54) METHODS OF MANUFACTURING A MASK BLANK SUBSTRATE, A MASK BLANK, A PHOTOMASK, AND A SEMICONDUCTOR DEVICE

(75) Inventor: Masaru Tanabe, Shinjuku-ku (JP)

(73) Assignee: Hoya Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/399,286

(22) Filed: Feb. 17, 2012

(65) Prior Publication Data

US 2012/0208112 A1    Aug. 16, 2012

Related U.S. Application Data

(62) Division of application No. 13/122,872, filed as application No. PCT/JP2010/054511 on Mar. 17, 2010, now Pat. No. 8,142,963.

(30) Foreign Application Priority Data

Mar. 25, 2009   (JP) .................................. 2009-074997

(51) Int. Cl.
  *G03F 1/00*    (2012.01)
  *G03B 27/62*    (2006.01)

(52) U.S. Cl.
  USPC ................................................ 430/5; 355/75

(58) Field of Classification Search
  USPC ........... 430/5, 30, 311, 313, 394; 355/53, 72, 355/75, 77
  See application file for complete search history.

(56) References Cited

U.S. PATENT DOCUMENTS

| 6,537,844 B1 | 3/2003 | Itoh |
| 6,869,732 B2 | 3/2005 | Takeuchi et al. |
| 8,142,963 B2 * | 3/2012 | Tanabe .............................. 430/5 |
| 2002/0155361 A1 | 10/2002 | Takeuchi et al. |
| 2004/0253524 A1 | 12/2004 | Itoh |
| 2005/0019676 A1 | 1/2005 | Nakatsu et al. |
| 2005/0019678 A1 | 1/2005 | Nakatsu et al. |
| 2005/0244726 A1 | 11/2005 | Itoh |
| 2006/0024591 A1 | 2/2006 | Itoh |
| 2006/0194126 A1 | 8/2006 | Tanabe |
| 2009/0035880 A1 | 2/2009 | Itoh |

FOREIGN PATENT DOCUMENTS

| JP | 2002-318450 A | 10/2002 |
| JP | 2003-50458 A | 2/2003 |
| JP | 2004-361432 A | 12/2004 |
| JP | 2005-43836 A | 2/2005 |
| JP | 2005-43837 A | 2/2005 |
| JP | 2006-39223 A | 2/2006 |
| JP | 2006-176341 A | 7/2006 |
| JP | 2006-224233 A | 8/2006 |
| JP | 2009-10139 A | 1/2009 |

* cited by examiner

*Primary Examiner* — Stephen Rosasco
(74) *Attorney, Agent, or Firm* — Sughrue Mion, PLLC

(57) ABSTRACT

A before-chucking main surface shape is measured in an actual measurement region of a main surface of a substrate which has been precision-polished. Based on that shape and a shape of a mask stage (1), a simulated after-chucking main surface shape of the substrate, when a photomask (2) manufactured from the substrate is set in an exposure apparatus, is obtained. A selection is made of the substrate in which the after-chucking main surface shape has a flatness of a first threshold value or less in a virtual calculation region thereof. A calculation is performed and a selection is made of the substrate in which an after-correction main surface shape has a flatness of a second threshold value or less in the correction region.

29 Claims, 8 Drawing Sheets (a)　　　　　　　　　(b)

(a)　　　　　　　　　(b)

METHODS OF MANUFACTURING A MASK BLANK SUBSTRATE, A MASK BLANK, A PHOTOMASK, AND A SEMICONDUCTOR DEVICE

CROSS-REFERENCE TO RELATED APPLICATIONS

This is a Divisional of application Ser. No. 13/122,872 filed May 4, 2011. The entire disclosure of the prior application, application Ser. No. 13/122,872, as well as the content of the National Stage of International Application No. PCT/JP2010/054511 filed on Mar. 17, 2010, claiming priority based on Japanese Patent Application Nos. 2009-074997, filed Mar. 25, 2009, the contents of all of which are incorporated herein by reference in their entirety.

TECHNICAL FIELD

This invention relates to a method of manufacturing a mask blank substrate for use in a mask blank which is for manufacturing a photomask adapted to be used in a photolithography process.

BACKGROUND ART

In a photolithography process of semiconductor manufacturing processes, a photomask is used. With the miniaturization of semiconductor devices, a demand for miniaturization in this photolithography process has been increasing. Particularly, an increase in NA of an exposure apparatus using ArF exposure light (193 nm) has proceeded for adaptation to the miniaturization and a further increase in NA is proceeding following the introduction of the immersion exposure technique. For adaptation to the demand for the high miniaturization and the increase in NA described above, it is required to enhance the flatness of a photomask. That is, in view of the fact that the allowable width of position offset of a transfer pattern due to the flatness has been reduced with the reduction in pattern line width and that the focal depth in the photolithography process has been reduced with the increase in NA, the flatness of main surfaces of a mask substrate, particularly the main surface on the side where a pattern is to be formed (hereinafter, the main surface on this side will be referred to simply as a main surface or a substrate main surface), is becoming unignorable.

FIG. 6 is diagrams showing the shapes of a substrate of a photomask before (before suction) and after (after suction) the photomask is chucked in an exposure apparatus, wherein FIG. 6(a) is a diagram showing the shape of the substrate before suction while FIG. 6(b) shows the shape of the substrate after suction. As seen from FIG. 6(a), four corners of the substrate are a little higher than chuck areas of a main surface and the height gradually increases toward its central portion. That is, generally circular contour lines are shown in the substrate before suction. In the substrate after suction, generally rectangular contour lines are shown as seen from FIG. 6(b). In this manner, when the photomask is chucked on a mask stage of the exposure apparatus by a vacuum chuck, it may happen that the photomask is largely deformed upon chucking due to the affinity with the mask stage or the vacuum chuck.

Conventionally, since the product management is conducted in terms of the flatness of the photomask before chucking, it may happen that even if the photomask is excellent with its main surface shape having high flatness before chucking, when the photomask is chucked on the mask stage of the exposure apparatus, the photomask is deformed depending on the affinity with the mask stage or the vacuum chuck so that the flatness thereof is largely degraded. This tendency is remarkable particularly in the case of a substrate that tends to be distorted due to low symmetry of the shape of its main surface. Thus, it is becoming necessary to consider the flatness of the photomask when it is chucked by the vacuum chuck. There has conventionally been proposed a method of selecting a mask substrate having good flatness after chucking on a mask stage of an exposure apparatus (see, e.g. Patent Document 1).

PRIOR ART DOCUMENT

Patent Document

Patent Document 1: JP-A-2003-50458

DISCLOSURE OF THE INVENTION

Problem to be Solved by the Invention

Using the mask substrate selection method of Patent Document 1, it is possible to relatively easily select a mask substrate whose flatness after chucking becomes a predetermined level or more. However, with the miniaturization of a transfer pattern, the condition of flatness required for the shape of a mask substrate after chucking is becoming more and more strict. For example, in the case of a mask substrate (substrate for a mask blank) with a 152 mm square size, the flatness in a 132 mm square region is required to be as high as 0.16 μm or further 0.08 μm. There has been a problem that if a substrate with such a flatness is selected by the selection method of Patent Document 1, the ratio of successful products is largely reduced so that the production yield is lowered.

On the other hand, with respect to the problem of the substrate deformation of the photomask when it is chucked on the mask stage, intensive studies have been made also on the exposure apparatus supply side. As a result thereof, there has been developed an exposure apparatus having a function of performing correction in a height direction (cross-sectional direction of a substrate) according to the shape of a photomask upon exposure. In the case of a photomask for use in such an exposure apparatus that can perform height-direction correction to the shape of the photomask when it is chucked on a mask stage, there is room for relaxation of a conventional mask blank substrate selection criterion. If the selection criterion can be relaxed, the production yield of mask blank substrates is improved. There has been desired a method of selecting a mask blank substrate adapted to the exposure apparatus having such a correction function.

This invention has been made in view of these circumstances and has an object to provide a method of manufacturing a mask blank substrate which is adapted to an exposure apparatus having a function of performing height-direction correction to the shape of a photomask.

Means for Solving the Problem

According to one aspect of this invention, there is provided a method of manufacturing a mask blank substrate for use in a photomask to be chucked on a mask stage of an exposure apparatus, comprising a step of preparing a substrate having a precision-polished main surface, a step of measuring a before-chucking main surface shape in an actual measurement region of the main surface, a step of obtaining, through simulation, an after-chucking main surface shape of the substrate when the photomask manufactured from the substrate is set in the exposure apparatus, based on the before-chucking main surface shape of the substrate and a shape of the mask stage, a step of selecting the substrate in which the after-chucking main surface shape has a flatness of a first threshold value or less in a virtual calculation region thereof, a step of performing correction for the selected substrate by calculating a first approximate curve approximate to a cross-sectional shape along a first direction in a correction region of the after-chucking main surface shape, calculating an approximate curved surface from the first approximate curve, and subtracting the approximate curved surface from the after-chucking main surface shape, thereby calculating an after-correction main surface shape, and a step of selecting the substrate in which the after-correction main surface shape has a flatness of a second threshold value or less in the correction region.

According to this method, an after-chucking main surface shape of a substrate (photomask) when a photomask is chucked on the mask stage of the exposure apparatus is obtained through simulation and then the same correction as substrate main surface shape correction in a height direction (cross-sectional direction of the substrate) which is actually performed by the exposure apparatus is further performed to calculate a flatness of the photomask. As a consequence, the ratio of successful mask blank substrates with an after-correction flatness satisfying a reference flatness is improved in unsuccessful mask blank substrates which do not satisfy the reference flatness when the height-direction correction by the exposure apparatus is not considered. Therefore, it is possible to achieve significant improvement in the production yield.

According to another aspect of this invention, there is provided a method of manufacturing a mask blank substrate for use in a photomask to be chucked on a mask stage of an exposure apparatus, comprising a step of preparing a substrate having a precision-polished main surface, a step of measuring a before-chucking main surface shape in an actual measurement region of the main surface, a step of obtaining, through simulation, an after-chucking main surface shape of the substrate when the photomask manufactured from the substrate is set in the exposure apparatus, based on the before-chucking main surface shape of the substrate and a shape of the mask stage, a step of selecting the substrate in which the after-chucking main surface shape has a flatness of a first threshold value or less in a virtual calculation region thereof, a step of performing correction for the selected substrate by calculating a first approximate curve approximate to a cross-sectional shape along a first direction in a correction region of the after-chucking main surface shape, calculating a second approximate curve approximate to a cross-sectional shape along a second direction perpendicular to the first direction, calculating an approximate curved surface from the first approximate curve and the second approximate curve, and subtracting the approximate curved surface from the after-chucking main surface shape, thereby calculating an after-correction main surface shape, and a step of selecting the substrate in which the after-correction main surface shape has a flatness of a second threshold value or less in the correction region.

According to this method, in the case where height-direction correction by the exposure apparatus functions not only in one direction (first direction), but also in a direction (second direction) perpendicular to that one direction, the ratio of successful mask blank substrates with an after-correction flatness satisfying a reference flatness is further improved in unsuccessful mask blank substrates which do not satisfy the reference flatness when the height-direction correction by the exposure apparatus is not considered.

When a photomask is chucked on the mask stage of the exposure apparatus, a substrate tends to be deformed into a quadratic surface due to a suction force of a chuck. Taking this modification into account, in a process of polishing a photomask blank substrate, the processing is carried out aiming at obtaining a substrate main surface with a convex shape which is relatively high at its central portion and relatively low at its peripheral portion. However, the substrate often has a main surface shape with a large quadratic component due to variation in polishing processing accuracy, the processing which is carried out in a manner to avoid a concave shape, and so on. As a consequence, it often happens that the quadratic component remains in an after-chucking main surface shape of the substrate after the photomask is chucked on the mask stage so that the flatness does not satisfy a predetermined value. In this case, using a quadratic curve as a first approximate curve and/or a second approximate curve to correct the quadratic component of the after-chucking main surface shape, the flatness can be set to the predetermined level or more and thus the ratio of substrates to be successful products is further improved.

In the case of a substrate having a before-chucking main surface shape with a strong quartic component (tendency to a quartic surface is strong), since deformation with a tendency to a quadratic surface is applied when a photomask is chucked on the mask stage, an after-chucking main surface tends to have a shape in which the quartic component remains (with a tendency to a quartic surface). In this case, using a quartic curve as a first approximate curve and/or a second approximate curve to correct the quartic component of the after-chucking main surface shape, the flatness can be set to a predetermined level or more and thus the ratio of substrates to be successful products is further improved.

If optical correction by the exposure apparatus is allowed such that the flatness correction amount of the substrate main surface using the first approximate curve and/or the second approximate curve exceeds 0.16 μm, the astigmatism becomes large when a transfer pattern of the photomask is actually transferred to a resist film on a semiconductor wafer by the exposure apparatus. As a consequence, there is a possibility that the image formation of the transfer pattern is degraded so that a predetermined or more pattern resolution is not satisfied. Thus, this is not preferable.

Since the deformation of the substrate is caused by chucking of the photomask by the exposure apparatus, it is necessary to also consider a region outside a region where a transfer pattern is to be formed. In general, a region where a transfer pattern is formed in a thin film of a photomask is often set to a 132 mm×104 mm region and, if the flatness of a 132 mm square region is good, there is often no problem. However, if the flatness of a region outside thereof is poor, there is a possibility that the substrate deformation amount before and after chucking is large. If the substrate deformation amount is large, the displacement amount of the transfer pattern formed on a substrate main surface is large so that the pattern position accuracy is lowered. Taking them into account, a virtual calculation region for selecting a substrate to be simulated is preferably set to a 142 mm square region.

In general, the region where the transfer pattern is formed in the thin film of the photomask is often set to the 132 mm×104 mm region. In order to allow the formation of the transfer pattern in any direction, it is preferable to set a correction region in the 132 mm square region and to ensure the flatness of the substrate main surface after chucking within a predetermined value.

It is not that the flatness of the before-chucking main surface shape of the substrate can take any value as long as the after-chucking main surface shape satisfies the first threshold value. In the case of a substrate in which an after-chucking main surface shape is good while the flatness of a before-chucking main surface shape is poor, the substrate deformation amount before and after chucking is large and thus the displacement amount of a transfer pattern formed on a substrate main surface is also large so that the pattern position accuracy is lowered. As a substrate to be simulated, it is preferable to select a substrate with a flatness of 0.4 μm or less in an actual calculation region. The actual calculation region is preferably a region including a virtual calculation region as a region for calculating a flatness from an after-chucking main surface shape after simulation and a correction region as a region for performing correction of subtracting an approximate curved surface. Further, taking into account the measurement accuracy of a flatness measuring apparatus, the accuracy of a simulation, and so on, the actual calculation region is more preferably a 142 mm square region.

In a mask blank substrate manufacturing method according to still another aspect of this invention, it is more preferable to use an exposure apparatus adapted to irradiate exposure light to a photomask through a slit which is movable in the first direction and extends in the second direction.

According to still another aspect of this invention, there is provided a method of manufacturing a mask blank, comprising forming a thin film on the main surface, on the side where the before-chucking main surface shape was measured, of the mask blank substrate obtained by the above-mentioned method.

According to yet another aspect of this invention, there is provided a method of manufacturing a photomask, comprising forming a transfer pattern in the thin film of the mask blank obtained by the above-mentioned method.

Effect of the Invention

According to a mask blank substrate manufacturing method of this invention, an after-chucking main surface shape of a substrate (photomask) when a photomask is chucked on a mask stage of an exposure apparatus is obtained through simulation and then the same correction as substrate main surface shape correction in a height direction (cross-sectional direction of the substrate) which is actually performed by the exposure apparatus is further performed to calculate a flatness of the photomask. As a consequence, the ratio of successful mask blank substrates with an after-correction flatness satisfying a reference flatness is improved in unsuccessful mask blank substrates which do not satisfy the reference flatness when the height-direction correction by the exposure apparatus is not considered. Therefore, it is possible to achieve significant improvement in the production yield.

MODE FOR CARRYING OUT THE INVENTION

Hereinbelow, an embodiment of this invention will be described in detail with reference to the drawings.

A mask blank substrate manufacturing method of this invention is for obtaining a mask blank substrate for a photomask that can be used in an exposure apparatus having a photomask shape correction function. Herein, the exposure apparatus having the photomask shape correction function will be described.

Figure 1:
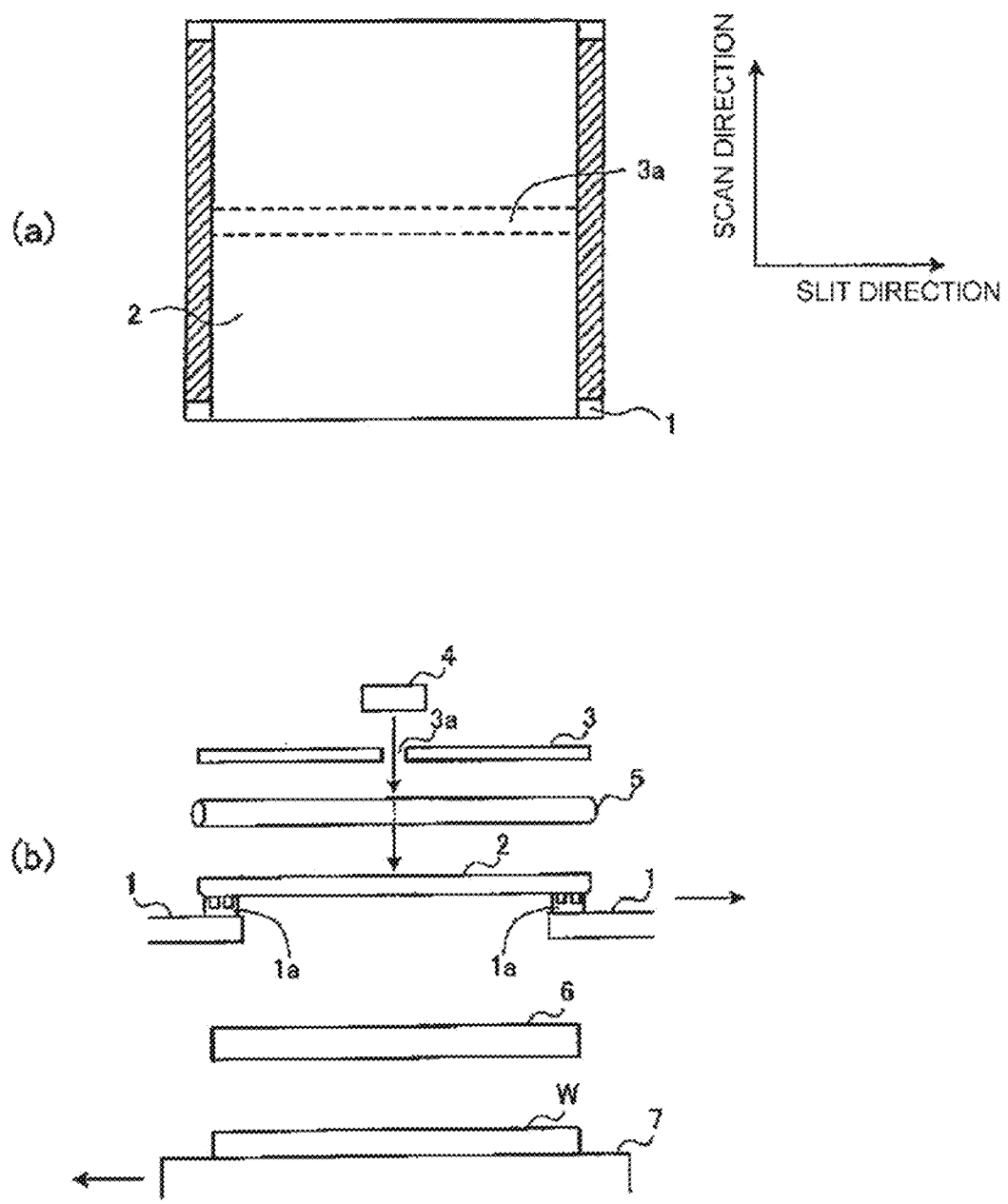
FIG. 1 is diagrams for explaining part of an exposure apparatus having a photomask shape correction function, wherein (a) is a plan view and (b) is a side view.

FIG. 1 is diagrams for explaining part of the exposure apparatus having the photomask shape correction function, wherein (a) is a plan view and (b) is a side view. In this exposure apparatus, a photomask 2 is placed on a mask stage 1 and it is chucked on the mask stage 1 by a chuck 1a. An illumination optical system 5 and a slit member 3 having a slit 3a are disposed above the mask stage 1 and a light source 4 is disposed above the slit member 3. Further, a reduction optical system 6 and a semiconductor wafer W placed on a wafer stage 7 are located below the mask stage 1.

In this exposure apparatus, exposure to the semiconductor wafer W is carried out while moving the mask stage 1 chucking thereon the photomask 2 in a scan direction and moving the wafer stage 7 in a direction opposite to the moving direction of the mask stage 1. In this event, light from the light source 4 passes through the slit 3a so as to be irradiated to the photomask 2 and then is irradiated to the semiconductor wafer W through the photomask 2. As a consequence, a transfer pattern is exposed to a photoresist provided on the semiconductor wafer W. The moving direction (scan direction) of the mask stage 1 and an extending direction (longitudinal direction) of the slit 3a are substantially perpendicular to each other.

In this exposure apparatus, it is possible to perform main surface shape correction according to the shape of the photomask which is measured and obtained in advance. In the scan direction, the main surface shape correction is performed by changing the relative distance between the mask stage and the wafer stage 7 placing thereon the semiconductor wafer W to change a scan path. On the other hand, in the slit direction, the main surface shape correction may be performed by changing the astigmatism to change the shape of illumination light. In the case of this exposure apparatus, the description has been given of the type that can perform the main surface shape correction in the two directions, i.e. the scan direction and the slit direction. However, depending on an exposure apparatus, main surface shape correction is performed only in the scan direction or only in the slit direction.

The mask blank substrate manufacturing method of this invention is a method of manufacturing a mask blank substrate for use in a photomask to be chucked on a mask stage of an exposure apparatus, comprising a step of preparing a substrate having a precision-polished main surface, a step of measuring a before-chucking main surface shape in an actual measurement region of the main surface, a step of obtaining, through simulation, an after-chucking main surface shape of the substrate when the photomask manufactured from the substrate is set in the exposure apparatus, based on the before-chucking main surface shape of the substrate and a shape of the mask stage, a step of selecting the substrate in which the after-chucking main surface shape has a flatness of a first threshold value or less in a virtual calculation region thereof, a step of performing correction for the selected substrate by calculating a first approximate curve approximate to a cross-sectional shape along a first direction in a correction region of the after-chucking main surface shape, calculating an approximate curved surface from the first approximate curve, and subtracting the approximate curved surface from the after-chucking main surface shape, thereby calculating an after-correction main surface shape, and a step of selecting the substrate in which the after-correction main surface shape has a flatness of a second threshold value or less in the correction region.

Alternatively, the mask blank substrate manufacturing method of this invention is a method of manufacturing a mask blank substrate for use in a photomask to be chucked on a mask stage of an exposure apparatus, comprising a step of preparing a substrate having a precision-polished main surface, a step of measuring a before-chucking main surface shape in an actual measurement region of the main surface, a step of obtaining, through simulation, an after-chucking main surface shape of the substrate when the photomask manufactured from the substrate is set in the exposure apparatus, based on the before-chucking main surface shape of the substrate and a shape of the mask stage, a step of selecting the substrate in which the after-chucking main surface shape has a flatness of a first threshold value or less in a virtual calculation region thereof, a step of performing correction for the selected substrate by calculating a first approximate curve approximate to a cross-sectional shape along a first direction in a correction region of the after-chucking main surface shape, calculating a second approximate curve approximate to a cross-sectional shape along a second direction perpendicular to the first direction, calculating an approximate curved surface from the first approximate curve and the second approximate curve, and subtracting the approximate curved surface from the after-chucking main surface shape, thereby calculating an after-correction main surface shape, and a step of selecting the substrate in which the after-correction main surface shape has a flatness of a second threshold value or less in the correction region.

Figure 2:
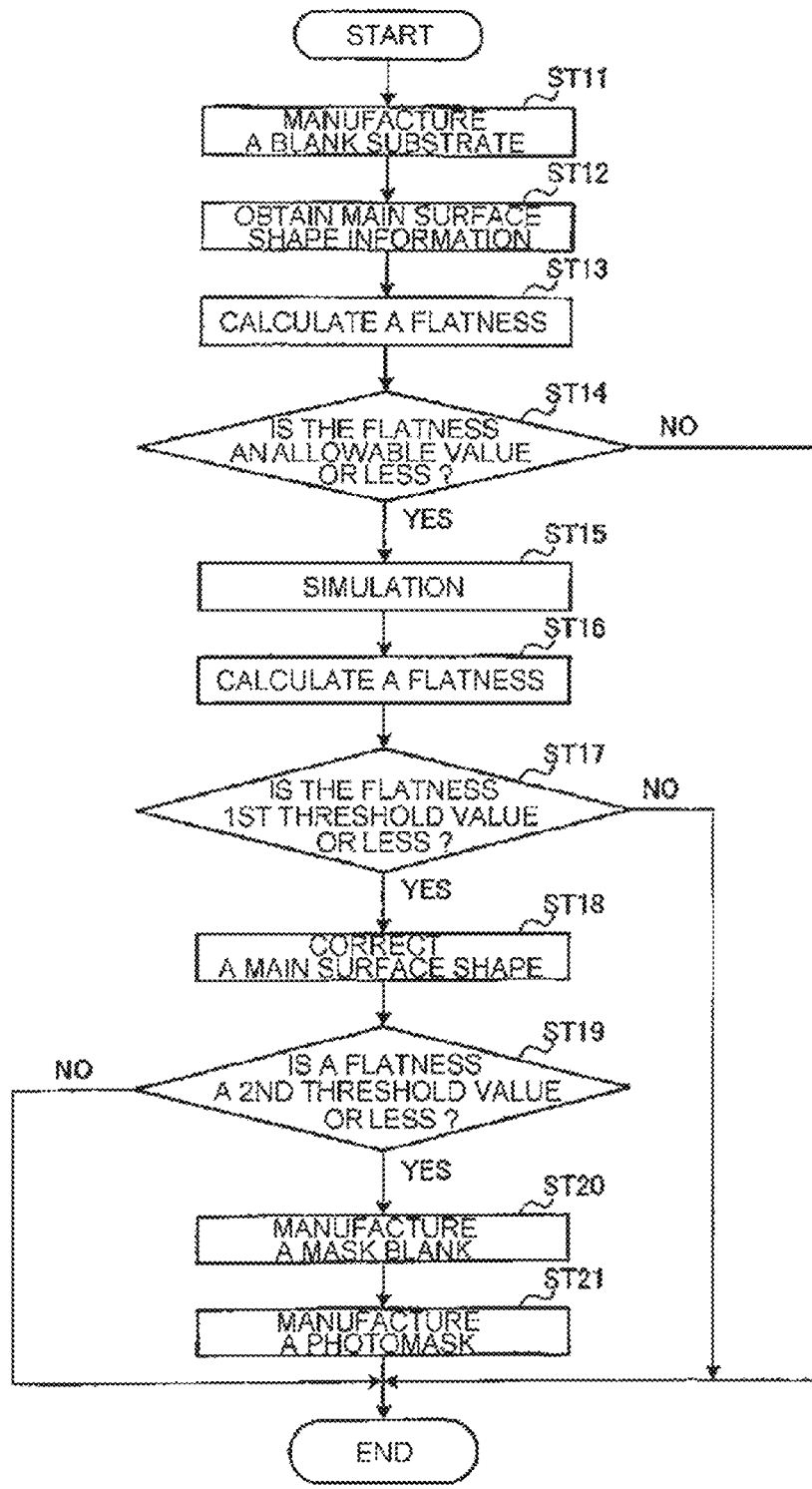
FIG. 2 is a flowchart for explaining a mask blank substrate manufacturing method according to an embodiment of this invention.

FIG. 2 is a flowchart for explaining a mask blank substrate manufacturing method according to the embodiment of this invention. In this manufacturing method, first, a mask blank substrate having a precision-polished main surface is manufactured (ST11).

In this invention, a glass substrate can be used as a mask blank substrate. The glass substrate is not particularly limited as long as it can be used for a mask blank. For example, there can be cited a synthetic quartz glass, a soda-lime glass, an aluminosilicate glass, a borosilicate glass, an alkali-free glass, or the like.

Such a mask blank substrate can be manufactured through, for example, a rough polishing process, a precision polishing process, and an ultra-precision polishing process.

Then, height information in an actual measurement region of the main surface of the mask blank substrate is obtained and, from this height information, information of the shape of the main surface before chucking, i.e. information of a before-chucking main surface shape, in a cross-sectional view of the mask blank substrate is obtained (ST12). The height information referred to herein represents height information from a reference plane at a plurality of measurement points set in the actual measurement region of the main surface of the mask blank substrate. As the actual measurement region, for example, it is possible to set a 146 mm×146 mm region when the size of the mask blank is 152 mm×152 mm. The actual measurement region is set to be a large region including at least a virtual calculation region and a correction region which will be described later.

The before-chucking main surface shape of the mask blank substrate is obtained by measurement with a wavelength-shift interferometer using a wavelength modulation laser. This wavelength-shift interferometer calculates, as phase differences, differences in height of a measuring surface of a mask blank substrate from interference fringes generated by the interference between reflected light reflected from the measuring surface and a back surface of the mask blank substrate and a measuring apparatus reference surface (front reference surface), detects differences in frequency of the interference fringes, and separates the interference fringes generated by the interference between the reflected light reflected from the measuring surface and the back surface of the mask blank substrate and the measuring apparatus reference surface (front reference surface), thereby measuring the shape of irregularities of the measuring surface.

In order to carry out a later-described simulation with high accuracy, it is preferable that the measurement points for obtaining the height information be set as many as possible. However, although more accurate simulation results can be obtained by increasing the number of the measurement points, the simulation requires a lot of time. Therefore, it is preferable to determine the measurement points taking these points into account. For example, the measurement points can be set to 256×256 points.

Then, based on the before-chucking main surface shape of the substrate obtained by the measurement, a flatness of the mask blank substrate is calculated from a difference between a maximum value and a minimum value in an actual calculation region including a transfer region of a photomask (ST13). Further, it is judged whether or not the flatness thus obtained is an allowable value or less (ST14). The mask blank substrate whose flatness is greater than the allowable value is not supplied to a subsequent process as judged unsuccessful. Even if the flatness of an after-chucking main surface shape of the mask blank substrate manufactured by this manufacturing method is good, if the flatness of the before-chucking main surface shape is poor, a problem may arise. In the substrate in which the flatness change amount before and after chucking is large, the substrate deformation amount is large. In a photomask manufactured from the substrate with the large substrate deformation amount, there is a possibility that the displacement amount of a transfer pattern, which is formed on the substrate main surface, before and after chucking becomes large, thus leading to a possibility that the pattern position accuracy after chucking is lowered. Taking this point into consideration, a selection is made of the substrate whose flatness before chucking is the allowable value or less. If the allowable level of the flatness before chucking is too high, the production yield is lowered so that the object of this invention cannot be achieved, while, if it is too low, there arises a possibility that a photomask is manufactured from a substrate with a large substrate deformation amount. In consideration of the balance therebetween, the allowable value of the flatness of the substrate before chucking is set to 0.4 μm or less. In the case of manufacturing a mask blank substrate for use in a photomask which requires high pattern position accuracy, since the substrate deformation amount is required to be smaller, the allowable value of the flatness of the substrate is preferably set to 0.3 μm or less.

On the other hand, the substrate deformation amount before and after chucking also changes depending on the size of the actual calculation region which is a region for calculating a flatness. There is a tendency that as the size of the actual calculation region increases, the substrate deformation amount before and after chucking decreases. First, it is necessary that the actual calculation region for calculating the flatness before chucking be a region which is equal to or smaller than the actual measurement region as a measurement region and is larger than the virtual calculation region. The predetermined region including the transfer region of the photomask is determined based on an exposure wavelength, the kind of a fine pattern (circuit pattern) to be formed on a semiconductor wafer, and so on. When the size of the mask blank is 152 mm square, the transfer region of the photomask is often set to a 104 mm×132 mm region. Taking this into account, the virtual calculation region can be set to a 132 mm square region. However, if the flatness of a region outside thereof is poor, the possibility increases that the substrate deformation amount before and after chucking becomes large. Also taking this into account, when the size of the mask blank (photomask) is 152 mm square, the actual calculation region is preferably set to an at least 142 mm square region. Further, when the measurement accuracy of the before-chucking main surface shape and the simulation accuracy are high, the actual calculation region is preferably set to a 146 mm square region or a 148 mm square region.

Then, based on the obtained before-chucking main surface shape and the shape of a mask stage, height information when the photomask manufactured from this substrate is set in an exposure apparatus is obtained through simulation and, from this height information, an after-chucking main surface shape in a cross-sectional view of the mask blank substrate is obtained (ST15). In this simulation process, by simulating a state where the photomask is set on the mask stage of the exposure apparatus, height information from the reference plane is obtained at the plurality of measurement points on the main surface of the substrate. Herein, information necessary for obtaining, through simulation, the height information at the plurality of measurement points on the substrate when the photomask is set in the exposure apparatus are the height information from the reference plane at the plurality of measurement points on the main surface of the substrate, which was obtained for obtaining the information of the above-mentioned before-chucking main surface shape, and shape information of the mask stage of the exposure apparatus including regions where the mask stage contacts the main surface of the substrate. According to a deflection differential equation in mechanics of materials by the use of these information, it is possible to obtain, through simulation, the height information from the reference plane at the plurality of measurement points on the main surface of the substrate when the photomask is set on the mask stage of the exposure apparatus. Then, an after-chucking main surface shape in a cross-sectional view of the substrate is obtained from the obtained height information.

In this process, based on the information of the before-chucking main surface shape of the substrate, the simulation is carried out in which the photomask manufactured from this substrate is chucked on the mask stage of the exposure apparatus. Since a thin film for transfer pattern formation will be formed on the surface of the mask blank substrate with high accuracy by sputtering in a later process, the change in thickness of this thin film in a main surface direction is in a range which is very small as compared with the flatness of the substrate and thus is ignorable. It can be said that even if the simulation is carried out based on the before-chucking main surface shape of the mask blank substrate, there arises no difference large enough to be influential.

The above-mentioned deflection differential equation is derived in the following manner, wherein a positive direction of Z-axis is defined as the direction of gravity.

$$H_2 = H_1 + B_1 + B_2 - H_{AB}$$

$H_2$: height information on the substrate main surface after chucking $H_1$: height information on the substrate main surface before chucking $B_1$: a warp of the substrate with respect to the mask stage as fulcrums (lever effect)

$B_2$: a deflection of the substrate due to gravity (approximately equal to 0.1 μm: maximum value at the center of the substrate)

$H_{AB}$: an average value of height information of the substrate in regions along the scan direction where the substrate contacts the mask stage The above-mentioned shape information of the mask stage may include, in addition to the positions and regions where the mask stage contacts the main surface of the substrate (regions each having a slit-direction width and a scan-direction width), flatness information of the mask stage in the above-mentioned regions (surfaces) where the mask stage contacts the main surface of the substrate. Further, the simulation method is not limited to the above and a simulation using the general finite element method may be employed.

Then, based on the after-chucking shape obtained through simulation, a flatness of the mask blank substrate is calculated from a difference between a maximum value and a minimum value in the virtual calculation region including the transfer region of the photomask (ST16). This flatness contributes to the formation of an excellent transfer pattern upon pattern transfer using the exposure apparatus. The virtual calculation region including the transfer region of the photomask is determined based on an exposure wavelength, the kind of a fine pattern (circuit pattern) to be formed on a semiconductor wafer, and so on. When the size of the mask blank is 152 mm square, the transfer region of the mask is often set to a 104 mm×132 mm region. Taking this into account, the virtual calculation region can be set to a 132 mm square region. However, if the flatness of a region outside thereof is poor, there is a possibility that the substrate deformation amount before and after chucking becomes large. In a photomask manufactured from such a substrate, there is a possibility that the displacement amount of a transfer pattern formed on the substrate main surface becomes large and thus the pattern position accuracy after chucking is lowered. Also taking this into account, when the size of the mask blank (photomask) is 152 mm square, the virtual calculation region is preferably set to an at least 142 mm square region. Further, when the measurement accuracy of the before-chucking main surface shape and the simulation accuracy are high, the virtual calculation region is preferably set to a 146 mm square region or a 148 mm square region.

Then, it is judged whether or not the flatness thus obtained is a first threshold value or less (ST17). This first threshold value of the flatness is selected based on a flatness of an after-correction main surface shape required for a photomask which is manufactured from the mask blank substrate and an allowable value of a flatness correction amount that allows the image formation of a transfer pattern on a resist film on a semiconductor wafer to satisfy a predetermined pattern resolution by height-direction correction by the exposure apparatus. When the flatness of the main surface after chucking required for the photomask (mask blank substrate) is 0.16 μm or less and the allowable value of the flatness correction amount of the exposure apparatus is 0.16 μm, the first threshold value can be set to 0.32 μm which is the sum of them. When the flatness of the main surface after chucking required for the photomask (mask blank substrate) is 0.08 μm or less and the allowable value of the flatness correction amount of the exposure apparatus is 0.16 μm, the first threshold value can be set to 0.24 μm which is the sum of them.

When the correction technique of an exposure apparatus is improved so that the allowable flatness correction amount is increased, the first threshold value can be set greater according to the upper limit of that correction amount. For example, when the flatness correction amount becomes greater such as 0.24 μm or 0.32 μm while the flatness required for the main surface after chucking of the photomask is 0.16 μm or less, the first threshold value can be set as large as 0.40 μm or 0.48 μm. When the flatness required for the main surface after chucking of the photomask is 0.08 μm or less, the first threshold value can be set as large as 0.32 μm or 0.40 μm.

Conversely, when the correction technique of an exposure apparatus is not improved while an increase in NA of the exposure apparatus further proceeds, the focus latitude for a reduction optical system and a semiconductor wafer decreases so that the allowable flatness correction amount becomes smaller, and therefore, the first threshold value should be set smaller. For example, when the flatness correction amount becomes smaller such as 0.12 μm, 0.10 μm, or 0.08 μm while the flatness required for the main surface after chucking of the photomask is 0.16 μm or less, the first threshold value should be set as small as 0.28 μm, 0.26 μm, or 0.24 μm. When the flatness required for the main surface after chucking of the photomask is 0.08 μm or less, the first threshold value should be set as small as 0.20 μm, 0.18 μm, or 0.16 μm.

Then, in the correction region of the after-chucking main surface shape, shape correction is performed by calculating a first approximate curve approximate to a cross-sectional shape along a first direction, calculating an approximate curved surface from the first approximate curve, and subtracting the approximate curved surface from the after-chucking main surface shape, thereby calculating an after-correction main surface shape (ST18). In the case of the exposure apparatus of the type that can perform main surface shape correction in two directions, i.e. the scan direction and the slit direction, shape correction is performed by calculating a first approximate curve approximate to a cross-sectional shape along a first direction, calculating a second approximate curve approximate to a cross-sectional shape of the correction region along a second direction perpendicular to the first direction, calculating an approximate curved surface from the first approximate curve and the second approximate curve, and subtracting the approximate curved surface from the after-chucking main surface shape, thereby calculating an after-correction main surface shape.

Figure 3:
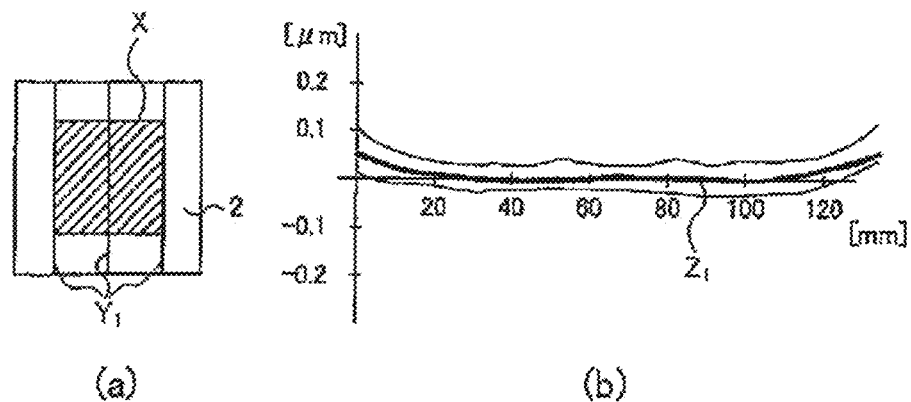
FIG. 3 is diagrams for explaining main surface shape correction in a scan direction, wherein (a) is a diagram showing positions where cross-sectional shapes of a substrate are obtained and (b) is a diagram showing the cross-sectional shapes of the substrate.
Figure 4:
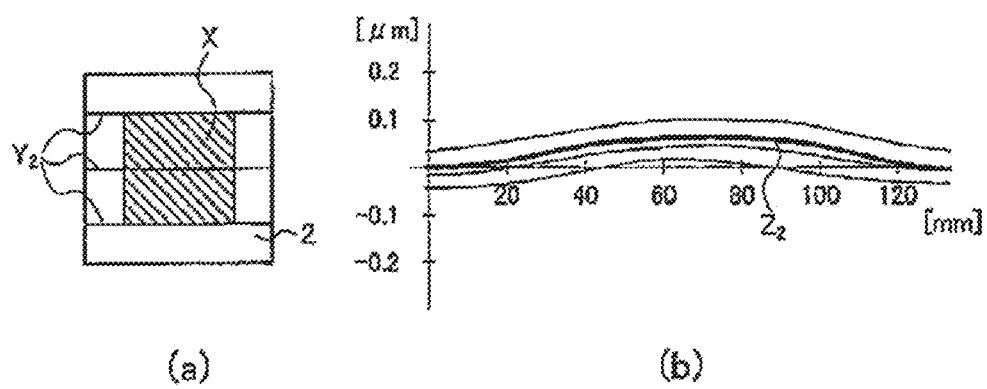
FIG. 4 is diagrams for explaining main surface shape correction in a slit direction, wherein (a) is a diagram showing positions where cross-sectional shapes of a substrate are obtained and (b) is a diagram showing the cross-sectional shapes of the substrate.

This main surface shape correction will be described using FIGS. 3 and 4. Herein, a description will be given of the case where the first direction is the scan direction of the exposure apparatus, the second direction is the slit direction of the exposure apparatus, the first approximate curve is a quartic curve, and the second approximate curve is a quadratic curve. FIG. 3 is diagrams for explaining main surface shape correction in the scan direction, wherein (a) is a diagram showing positions where cross-sectional shapes of a substrate are obtained and (b) is a diagram showing the cross-sectional shapes of the substrate. FIG. 4 is diagrams for explaining main surface shape correction in the slit direction, wherein (a) is a diagram showing positions where cross-sectional shapes of a substrate are obtained and (b) is a diagram showing the substrate shapes.

In the main surface shape correction in the scan direction (first direction), as shown in FIG. 3(a), cross-sectional shapes of the substrate in the scan direction are respectively obtained from height information along right-end, middle, and left-end straight lines $Y_1$, each being parallel to the scan direction, in a correction region X of an after-chucking main surface shape of a mask blank substrate and, then, by calculating a quartic curve for the cross-sectional shapes at the three positions by the method of least squares, an approximate curve (first approximate curve) $Z_1$ in the scan direction is obtained as shown in FIG. 3(b). In the main surface correction in the slit direction (second direction), as shown in FIG. 4(a), cross-sectional shapes of the substrate in the slit direction are respectively obtained from height information along upper-end, middle, and lower-end straight lines $Y_2$, each being parallel to the slit direction, in a correction region X of an after-chucking main surface shape of a mask blank substrate and, then, by calculating a quadratic curve for the cross-sectional shapes at the three positions by the method of least squares, an approximate curve (second approximate curve) $Z_2$ in the slit direction is obtained as shown in FIG. 4(b). Then, in the case of the exposure apparatus adapted to perform correction only in the scan direction (first direction), an approximate curved surface is calculated from the first approximate curve $Z_1$, while, in the case of the exposure apparatus adapted to perform correction only in the slit direction (second direction), an approximate curved surface is calculated from the second approximate curve $Z_2$. Then, correction is performed by subtracting this approximate curved surface from the after-chucking shape obtained through simulation, thereby calculating an after-correction main surface shape.

On the other hand, in the case of the exposure apparatus adapted to perform correction in both the scan direction (first direction) and the slit direction (second direction), correction is performed by calculating an approximate curved surface from the first approximate curve $Z_1$ and the second approximate curve $Z_2$ and then subtracting this approximate curved surface from the after-chucking shape obtained through simulation, thereby calculating an after-correction main surface shape. Alternatively, correction is performed by subtracting an approximate curved surface calculated from the first approximate curve $Z_1$ and further subtracting an approximate curved surface calculated from the second approximate curve $Z_2$, from the after-chucking shape obtained through simulation, thereby calculating an after-correction main surface shape.

This main surface shape correction simulates main surface shape correction which is performed by the exposure apparatus having the correction function. The after-correction main surface shape obtained by this simulation becomes basically the same as a substrate shape after a photomask manufactured from the substrate subjected to this simulation is chucked in the exposure apparatus and the main surface shape correction is performed (it does not become completely the same due to mechanical error of the exposure apparatus, flatness measurement error, simulation error, change in shape due to attachment of a pellicle, etc., but this difference is small enough not to affect judgment).

With respect to the correction region X, a transfer region, where a transfer pattern is formed, of a photomask is determined based on an exposure wavelength, the kind of a fine pattern (circuit pattern) to be formed on a semiconductor wafer, and so on. When the size of a mask blank is 152 mm square, the transfer region of the mask is often set to a 104 mm×132 mm region. Taking this into account, the correction region X is preferably set to a 132 mm square region. When higher accuracy is required for the photomask, the correction region X is preferably set to a 142 mm square region.

Herein, the substrate cross-sectional shapes are obtained at the three positions in the correction region X in each of the scan direction (first direction) and the slit direction (second direction). On the other hand, when higher simulation accuracy is required for the first approximate curve, the second approximate curve, and the approximate curved surface/surfaces calculated therefrom, each approximate curve may be calculated from substrate cross-sectional shapes at four or more positions. Further, herein, a quartic curve is used as the first approximate curve and a quadratic curve is used as the second approximate curve, but not limited thereto. A quadratic curve may be applied to the first approximate curve while a quartic curve may be applied to the second approximate curve. Alternatively, the first approximate curve and the second approximate curve may both be quadratic curves (in this case, a composite approximate curved surface becomes a quadratic surface) or quartic curves (in this case, a composite approximate curved surface becomes a quartic surface). It is most preferable that a selection be made so that a correction simulation becomes closest to the main surface shape correction function of the exposure apparatus that actually chucks the photomask.

Then, based on the after-correction main surface shape obtained by the main surface shape correction, a flatness of the mask blank substrate after the correction is calculated from a difference between a maximum value and a minimum value of height information in the correction region including the transfer region of the photomask, and it is judged whether or not the flatness is a second threshold value or less (ST19).

The after-correction main surface shape is obtained by simulating the substrate main surface shape after the photomask (mask blank substrate) is chucked on the mask stage of the exposure apparatus and the main surface shape correction is performed by the correction function. That is, if this after-correction main surface shape satisfies the flatness of the pattern transfer region (correction region is a region including at least the pattern transfer region) required for the photomask which is manufactured using this mask blank substrate, such a mask blank substrate can be judged as a successful mask blank substrate. Therefore, as the second threshold value herein, a selection is preferably made of the flatness of the pattern transfer region required for the photomask which is manufactured using the mask blank. For example, the correction region is set to a 132 mm square region and the second threshold value is set to 0.16 μm. In the case of a mask blank substrate for use in a photomask which requires higher accuracy, the correction region may be set to a 132 mm square region and the second threshold value may be set to 0.08 μm. Only the mask blank substrate judged to satisfy the flatness of this second threshold value is supplied to later-described mask blank and photomask manufacturing processes. The above-mentioned respective regions are preferably set with respect to the center of the substrate main surface.

By forming at least a light-shielding film on the main surface of the mask blank substrate judged to be a successful product with a flatness of the second threshold value or less, a mask blank can be obtained (ST20). As a material forming this light-shielding film, there can be cited chromium, metal silicide, or tantalum. Depending on the use and structure of a photomask, another film such as an antireflection film or a phase shift film may be appropriately formed. As a material of the antireflection film, it is preferable to use CrO, CrON, CrOCN, or the like in the case of a chromium-based material, MoSiON, MoSiO, MoSiN, MoSiOC, or MoSiOCN in the case of a MoSi-based material, or TaO, TaON, TaBO, TaBON, or the like in the case of a tantalum-based material. As a material of the phase shift film, it is preferable to use MSiON, MSiO, MSiN, MSiOC, MSiOCN (M: Mo, W, Ta, Zr, or the like), or the like.

The light-shielding film can be formed by sputtering. As a sputtering apparatus, it is possible to use a DC magnetron sputtering apparatus, an RF magnetron sputtering apparatus, or the like. When sputtering the light-shielding film on the mask blank substrate, it is preferable to rotate the substrate and to dispose a sputtering target at a position inclined by a predetermined angle with respect to a rotation axis of the substrate, thereby forming the light-shielding film. By such a film forming method, it is possible to reduce in-plane variation of the light-shielding film and thus to uniformly form the light-shielding film.

Figure 5:
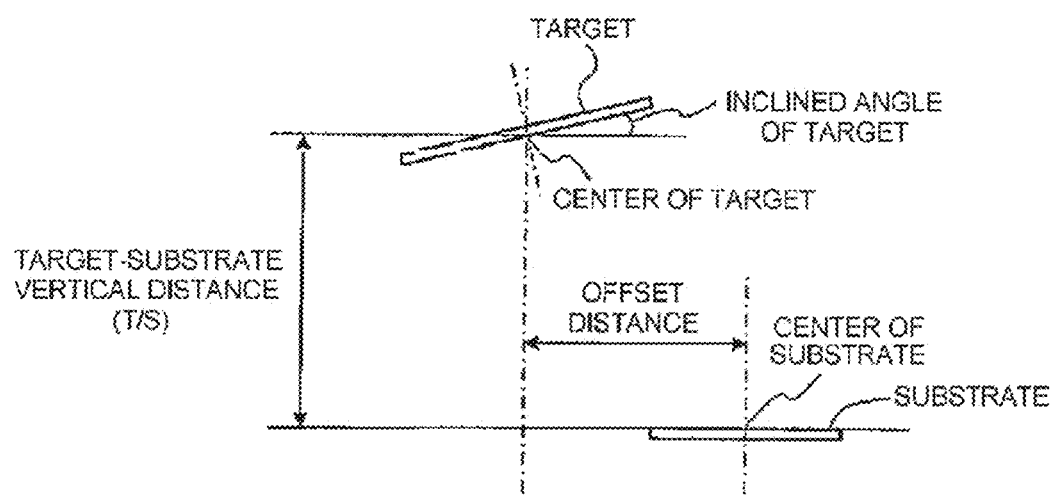
FIG. 5 is a diagram showing a schematic structure of a sputtering apparatus for use in manufacturing a mask blank according to the embodiment of this invention.

In the case of carrying out the film formation by rotating the substrate and disposing the sputtering target at the position inclined by the predetermined angle with respect to the rotation axis of the substrate, the in-plane distributions of the phase angle and the transmittance also change by the positional relationship between the substrate and the target. The positional relationship between the target and the substrate will be explained with reference to FIG. 5. The offset distance (distance between the central axis of the substrate and a straight line passing through the center of the target and parallel to the central axis of the substrate) is adjusted by an area in which the phase angle and transmittance distributions are to be ensured. In general, when such an area for ensuring the distributions is large, the required offset distance becomes long. In this embodiment, in order to realize a phase angle distribution within ±2° and a transmittance distribution within ±0.2% in 142 mm square of the substrate, the offset distance is required to be about 200 mm to 350 mm and is preferably 240 mm to 280 mm. The optimal range of the target-substrate vertical distance (T/S) changes depending on the offset distance, but in order to realize the phase angle distribution within ±2° and the transmittance distribution within ±0.2% in 142 mm square of the substrate, the target-substrate vertical distance (T/S) is required to be about 200 mm to 380 mm and is preferably 210 mm to 300 mm. The target inclination angle affects the film forming rate and, in order to obtain a high film forming rate, the target inclination angle is suitably 0° to 45° and preferably 10° to 30°.

By patterning at least the above-mentioned light-shielding film by photolithography and etching to form a transfer pattern, a photomask can be manufactured (ST21). An etchant for etching is properly changed depending on a material of a film to be etched.

The obtained photomask is set on the mask stage of the exposure apparatus and, using this photomask and using photolithography with ArF excimer laser light as exposure light, the mask pattern of the photomask is transferred to a resist film formed on a semiconductor wafer to thereby form a required circuit pattern on the semiconductor wafer, so that a semiconductor device is manufactured.

Next, a description will be given of Examples which were carried out for clarifying the effect of this invention. In the following Examples, a description will be given of the case where a mask blank substrate is a glass substrate.

Example 1

A predetermined number of glass substrates (about 152 mm×152 mm×6.45 mm) obtained by lapping and chamfering synthetic quartz glass substrates were set in a double-side polishing machine and subjected to a rough polishing process under the following polishing conditions. After the rough polishing process, the glass substrates were ultrasonically cleaned for removing polishing abrasive particles adhering to the glass substrates. The polishing conditions such as the processing pressure, the rotational speeds of upper and lower surface plates, and the polishing time were properly adjusted.

Polishing Liquid: cerium oxide (average particle size 2 μm to 3 μm)+water

Polishing Pad: hard polisher (urethane pad)

Then, the predetermined number of the glass substrates after the rough polishing were set in a double-side polishing machine and subjected to a precision polishing process under the following polishing conditions. After the precision polishing process, the glass substrates were ultrasonically cleaned for removing polishing abrasive particles adhering to the glass substrates. The polishing conditions such as the processing pressure, the rotational speeds of upper and lower surface plates, and the polishing time were properly adjusted. The polishing is carried out by adjusting various conditions so that the shape of a main surface, on the side where a transfer pattern is to be formed, of each of the glass substrates after the precision polishing process becomes convex at four corners. This is because the next ultra-precision polishing process has a feature to preferentially polish four corners of the substrate main surface, and thus this makes it possible to suppress edge exclusion at the four corners and to achieve a flatness of 0.4 μm or less in 142 mm square of the substrate main surface.

Polishing Liquid: cerium oxide (average particle size 1 μm)+water

Polishing Pad: soft polisher (suede type)

Then, the predetermined number of the glass substrates after the precision polishing were set in a double-side polishing machine and subjected to the ultra-precision polishing process under the following polishing conditions. After the ultra-precision polishing process, the glass substrates were ultrasonically cleaned for removing polishing abrasive particles adhering to the glass substrates. The polishing conditions such as the processing pressure, the rotational speeds of upper and lower surface plates, and the polishing time were properly adjusted. In this ultra-precision polishing process, there is the feature that the four corners tend to be preferentially polished due to the substrate shape being square. The polishing conditions are set so that the flatness in 142 mm square of the substrate main surface does not exceed 0.4 μm while the surface roughness of the substrate main surface becomes a predetermined roughness of 0.4 nm or less. In this manner, the glass substrates according to this invention were manufactured (ST11).

Polishing Liquid: colloidal silica (average particle size 100 nm)+water

Polishing Pad: super-soft polisher (suede type)

Figure 6:
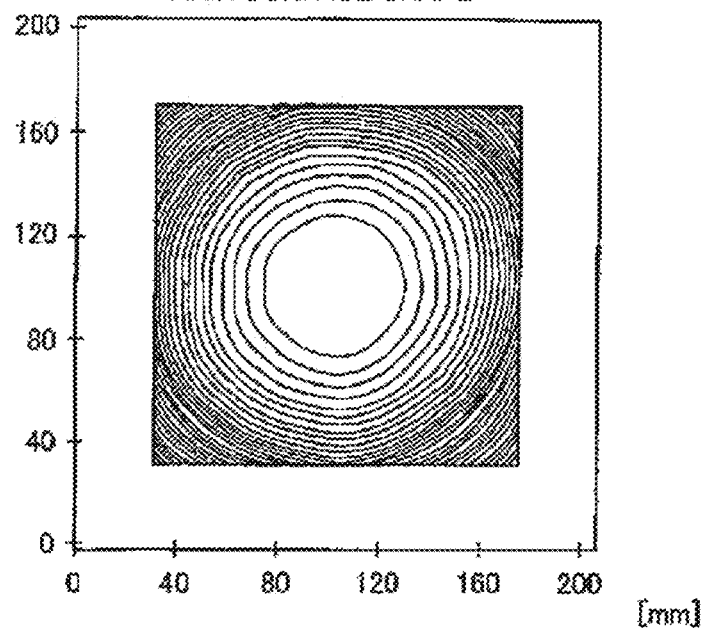
FIG. 6 is diagrams showing the shapes of a substrate of a photomask before and after the substrate is chucked in an exposure apparatus, wherein (a) is a diagram showing a before-chucking main surface shape and (b) is a diagram showing an after-chucking main surface shape.
Figure 6:
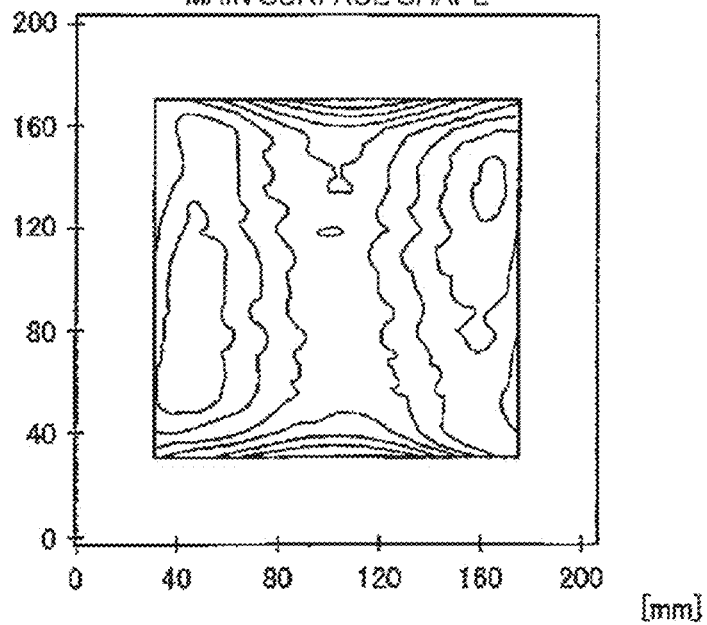

With respect to the main surface of each of the glass substrates thus obtained, with the use of a wavelength-shift interferometer using a wavelength modulation laser, information of a before-chucking main surface shape (height information from a focal plane (virtual absolute plane) calculated by the method of least squares) was obtained at 256×256 measurement points in an actual measurement region (150 mm×150 mm) of the main surface (main surface where a thin film was to be formed) of the substrate (see a before-chucking main surface shape in FIG. 6(a)) and was stored in a computer (ST12). Then, a flatness in an actual calculation region (142 mm×142 mm) was obtained from the measured height information of the before-chucking main surface shape in the actual measurement region (ST13) and the substrate with an allowable value (0.4 μm) or less was selected (ST14). As a result, the number of the glass substrates satisfying this condition was 99 out of 100. From this height information, the surface shape of the main surface of each substrate was such that the height of the main surface was gradually reduced from its central region toward its peripheral portion.

Then, based on the obtained information of the before-chucking main surface shape and shape information of a mask stage of an exposure apparatus, an after-chucking main surface shape being information of the height from the reference plane when the substrate was set in the exposure apparatus was calculated through simulation at the respective measurement points using the above-mentioned deflection differential equation (see an after-chucking main surface shape in FIG. 6(b)) (ST15). Then, from the result of this simulation, a difference between a maximum value and a minimum value from the reference plane was obtained in a virtual calculation region (142 mm×142 mm) including a transfer region of a photomask, thereby calculating a flatness in the virtual calculation region (ST16). Then, the substrate with a flatness of a first threshold value (0.32 μm) or less was selected (ST17). As a result, the number of the substrates satisfying this condition was 98 out of 99.

Figure 7:
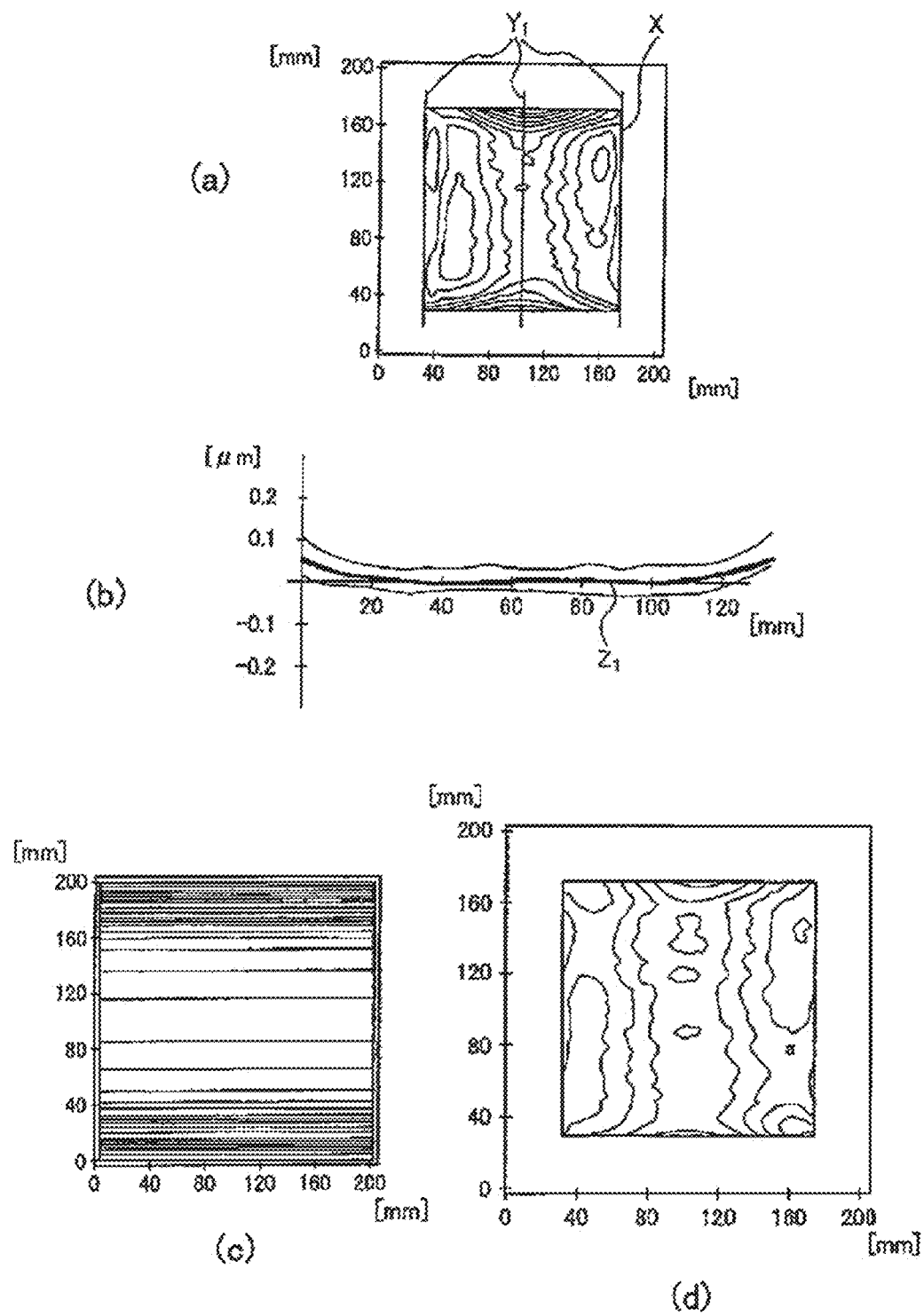
FIG. 7 is diagrams for explaining main surface shape correction in Example 1, wherein (a) is a diagram showing positions where cross-sectional shapes of a substrate are obtained, (b) is a diagram showing the cross-sectional shapes of the substrate, (c) is a diagram showing an approximate curved surface, and (d) is a diagram showing an after-correction main surface shape.

Then, main surface shape correction in the scan direction (first direction) was performed (ST18). With respect to the glass substrate having the after-chucking main surface shape shown in FIG. 6(b), as shown in FIG. 7(a), cross-sectional shapes of the substrate in the scan direction are respectively obtained from height information along right-end, middle, and left-end straight lines $Y_1$, each being parallel to the scan direction, in a correction region X of the after-chucking main surface shape of the mask blank substrate and, then, by calculating a quartic curve for the cross-sectional shapes at the three positions by the method of least squares, an approximate curve (first approximate curve) $Z_1$ in the scan direction is obtained as shown in FIG. 7(b). Then, an approximate curved surface shown in FIG. 7(c) is calculated from the approximate curve $Z_1$ and is subtracted from the after-chucking shape obtained through simulation. An after-correction main surface shape of the glass substrate after subtracting the approximate curved surface is shown in FIG. 7(d).

Then, a flatness in the correction region (132 mm×132 mm) of the calculated after-correction main surface was calculated and the substrate with a second threshold value (0.16 μm) or less was selected (ST19). This second threshold value was a criterion flatness required for the mask blank substrate.

As a result, the number of the glass substrates satisfying this condition was 96 out of 98. If the substrate satisfying the condition of 0.16 μm, equal to the second threshold value, or less is selected based on the flatness (ST16) obtained from the after-chucking main surface shape of the substrate calculated by the conventional simulation (ST15), the number of the selected substrates is 90 out of 98. Therefore, it is seen that the production yield is largely improved by performing the main surface shape correction (ST18).

Then, on the glass substrate thus obtained, a back-surface antireflection layer, a light-shielding layer, and a front-surface antireflection layer were formed in this order as a thin film (light-shielding film) for transfer pattern formation (ST20). Specifically, using a Cr target as a sputtering target and using a mixed gas of Ar, $CO_2$, $N_2$, and He (gas flow rate ratio Ar:$CO_2$:$N_2$:He=24:29:12:35) as a sputtering gas, a CrOCN film was formed to a thickness of 39 nm as the back-surface antireflection layer by setting the gas pressure to 0.2 Pa and the power of the DC power supply to 1.7 kW. Then, using a Cr target as a sputtering target and using a mixed gas of Ar, NO, and He (gas flow rate ratio Ar:NO:He=27:18:55) as a sputtering gas, a CrON film was formed to a thickness of 17 nm as the light-shielding layer by setting the gas pressure to 0.1 Pa and the power of the DC power supply to 1.7 kW. Then, using a Cr target as a sputtering target and using a mixed gas of Ar, $CO_2$, $N_2$, and He (gas flow rate ratio Ar:$CO_2$:$N_2$:He=21:37:11:31) as a sputtering gas, a CrOCN film was formed to a thickness of 14 nm as the front-surface antireflection layer by setting the gas pressure to 0.2 Pa and the power of the DC power supply to 1.8 kW. The back-surface antireflection layer, the light-shielding layer, and the front-surface antireflection layer formed under these conditions had very low stress over the entire light-shielding film and thus it was possible to suppress the change in shape of the substrate to minimum. In this manner, a mask blank was manufactured.

By patterning the light-shielding film of the mask blank thus obtained into a predetermined pattern, a photomask (binary mask) was manufactured (ST21). The obtained photomask was verified using an exposure apparatus capable of performing main surface shape correction at least in the scan direction. After chucking the photomask on a mask stage of the exposure apparatus and performing main surface shape correction in the scan direction, the pattern of the photomask was exposed and transferred to a resist film of a semiconductor wafer W. The CD accuracy and the pattern position accuracy of the pattern transferred to the resist film were verified and it was confirmed that the photomask was sufficiently adaptable to the DRAM hp32 nm generation.

Example 2

Figure 8:
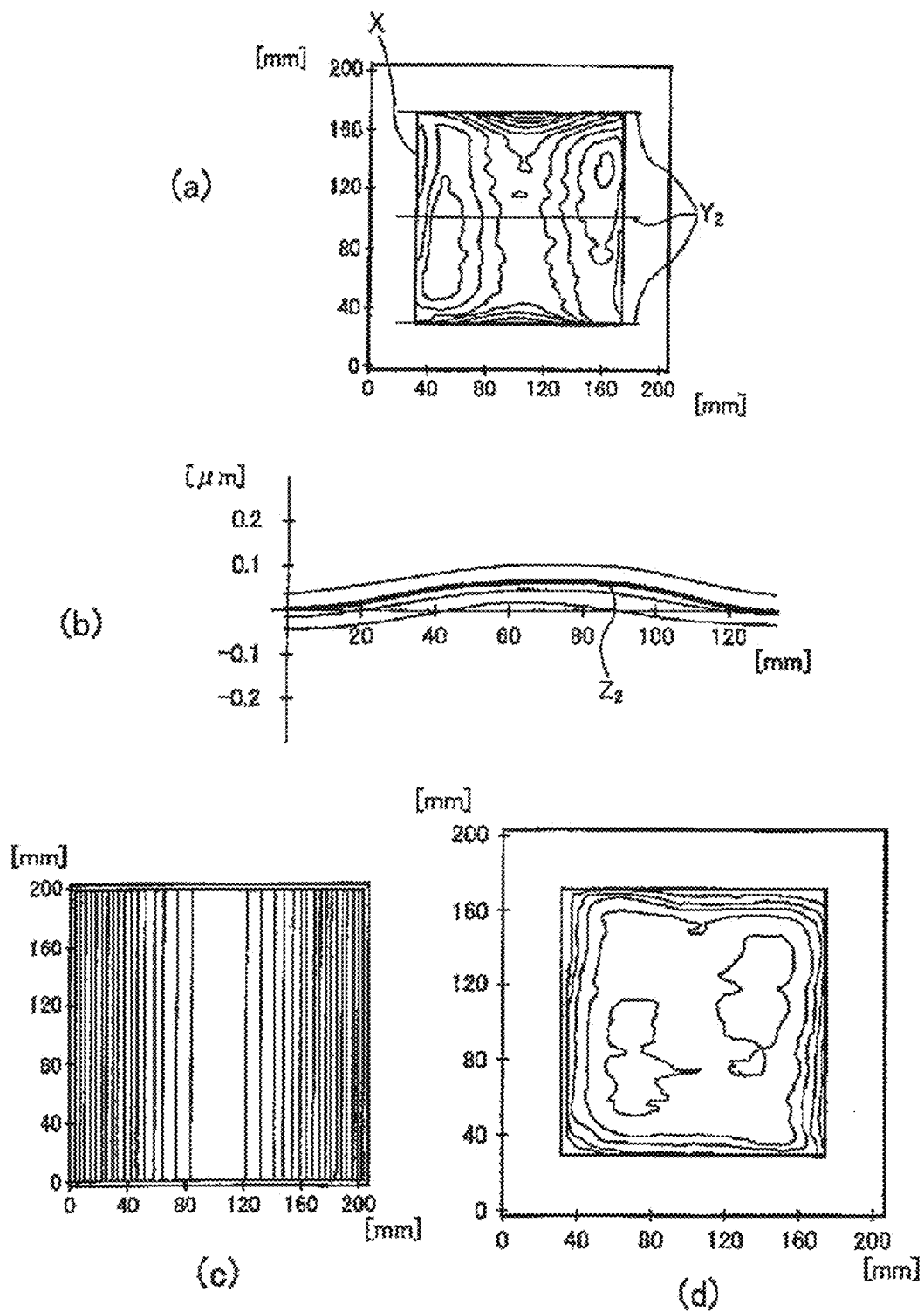
FIG. 8 is diagrams for explaining main surface shape correction in Example 2, wherein (a) is a diagram showing positions where cross-sectional shapes of a substrate are obtained, (b) is a diagram showing the cross-sectional shapes of the substrate, (c) is a diagram showing an approximate curved surface, and (d) is a diagram showing an after-correction main surface shape.

Steps ST11 to ST17 were carried out in the same manner as in Example 1 to select 98 glass substrates. Then, main surface shape correction in the slit direction (second direction) was performed (ST18). With respect to the glass substrate having the after-chucking main surface shape shown in FIG. 6(b), as shown in FIG. 8(a), cross-sectional shapes of the substrate in the slit direction are respectively obtained from height information along upper-end, middle, and lower-end straight lines $Y_2$, each being parallel to the slit direction, in a correction region X of the after-chucking main surface shape of the mask blank substrate and, then, by calculating a quadratic curve for the cross-sectional shapes at the three positions by the method of least squares, an approximate curve (second approximate curve) $Z_2$ in the slit direction is obtained as shown in FIG. 8(b). Then, an approximate curved surface shown in FIG. 8(c) is calculated from the approximate curve $Z_2$ and is subtracted from the after-chucking shape obtained through simulation. A substrate shape after subtracting the approximate curved surface $Z_1$ is shown in FIG. 8(d).

Then, a flatness in the correction region (132 mm×132 mm) of the calculated after-correction main surface was calculated and the substrate with a second threshold value (0.16 μm) or less was selected (ST19). This second threshold value was a criterion flatness required for the mask blank substrate. As a result, the number of the glass substrates satisfying this condition was 95 out of 98. If the substrate satisfying the condition of 0.16 μm, equal to the second threshold value, or less is selected based on the flatness obtained from the after-chucking main surface shape of the substrate (ST15) calculated by the conventional simulation (ST14), the number of the selected substrates is 90 out of 98. Therefore, it is seen that the production yield is largely improved by performing the main surface shape correction (ST18).

Then, on the glass substrate thus obtained, a phase shift film and a light-shielding film comprising a back-surface antireflection layer, a light-shielding layer, and a front-surface antireflection layer were formed as a thin film for transfer pattern formation, thereby manufacturing a mask blank (ST20). Specifically, using a target of Mo:Si=10:90 (at % ratio) and using a mixed gas of Ar, $N_2$, and He (gas flow rate ratio Ar:$N_2$:He=5:49:46) as a sputtering gas, a MoSiN film was formed to a thickness of 69 nm as the phase shift film by setting the gas pressure to 0.3 Pa and the power of the DC power supply to 2.8 kW. Then, the substrate formed with the phase shift film was heat-treated (annealed) at 250° C. for 5 minutes.

Then, the light-shielding film comprising the back-surface antireflection layer, the light-shielding layer, and the front-surface antireflection layer was formed. Specifically, first, using a Cr target as a sputtering target and using a mixed gas of Ar, $CO_2$, $N_2$, and He (gas flow rate ratio Ar:$CO_2$:$N_2$:He=22:39:6:33) as a sputtering gas, a CrOCN film was formed to a thickness of 30 nm as the back-surface antireflection layer by setting the gas pressure to 0.2 Pa and the power of the DC power supply to 1.7 kW. Then, using a Cr target as a sputtering target and using a mixed gas of Ar and $N_2$ (gas flow rate ratio Ar:$N_2$=83:17) as a sputtering gas, a CrN film was formed to a thickness of 4 nm as the light-shielding layer by setting the gas pressure to 0.1 Pa and the power of the DC power supply to 1.7 kW. Then, using a Cr target as a sputtering target and using a mixed gas of Ar, $CO_2$, $N_2$, and He (gas flow rate ratio Ar:$CO_2$:$N_2$:He=21:37:11:31) as a sputtering gas, a CrOCN film was formed to a thickness of 14 nm as the front-surface antireflection layer by setting the gas pressure to 0.2 Pa and the power of the DC power supply to 1.8 kW. The back-surface antireflection layer, the light-shielding layer, and the front-surface antireflection layer formed under these conditions had very low stress over the entire light-shielding film and the phase shift film also had very low stress, and thus it was possible to suppress the change in shape of the substrate to minimum.

Further, by patterning the light-shielding film and the phase shift film of the mask blank into a predetermined pattern, a photomask (phase shift mask) was manufactured (ST21). The obtained photomask was verified using an exposure apparatus capable of performing main surface shape correction at least in the slit direction. After chucking the photomask on a mask stage of the exposure apparatus and performing main surface shape correction in the slit direction, the pattern of the photomask was exposed and transferred to a resist film of a semiconductor wafer W. The CD accuracy and the pattern position accuracy of the pattern transferred to the resist film were verified and it was confirmed that the photomask was sufficiently adaptable to the DRAM hp32 nm generation.

Example 3

Figure 9:
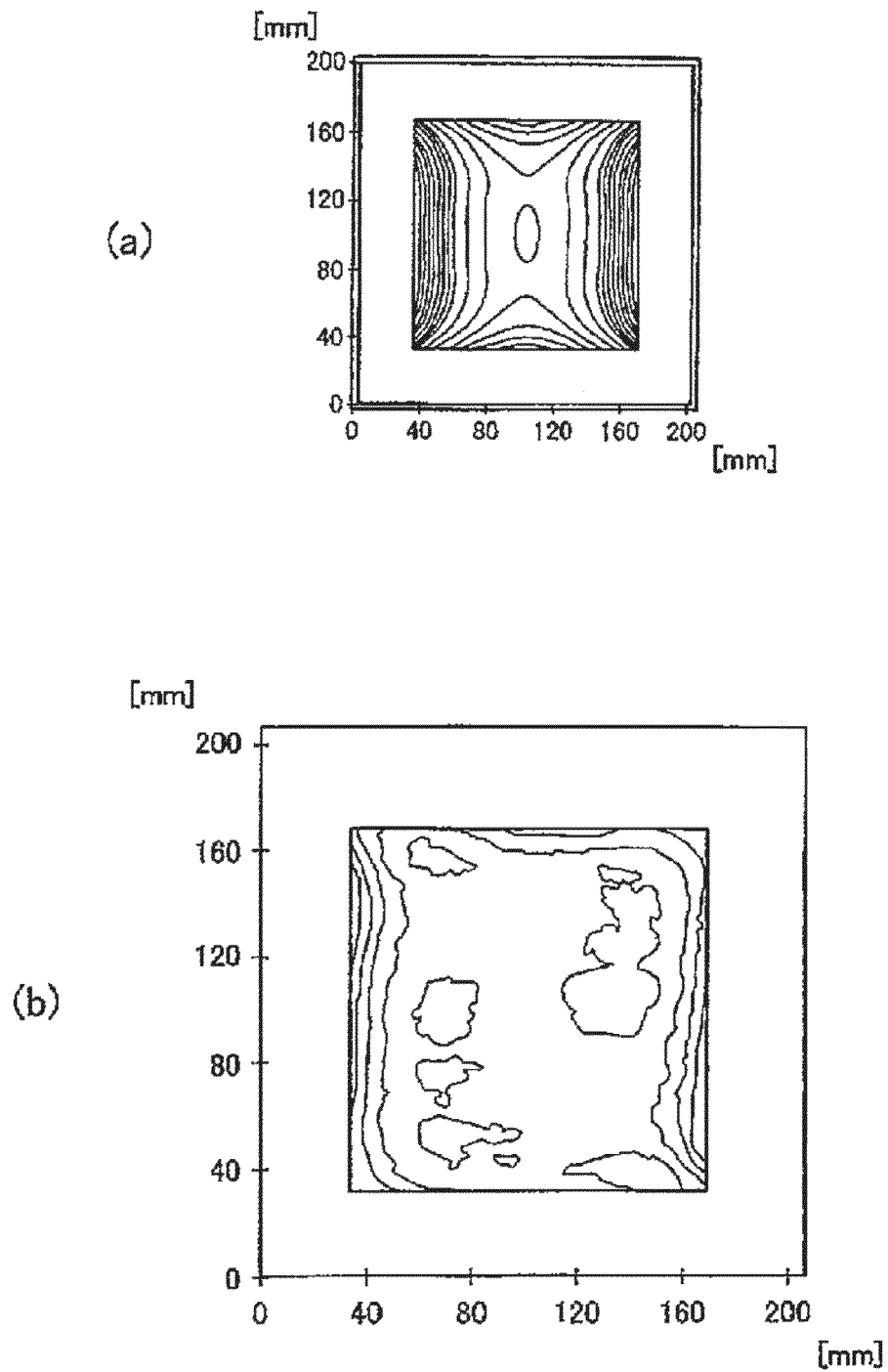
FIG. 9 is diagrams for explaining main surface shape correction in Example 3, wherein (a) is a diagram showing an approximate curved surface and (b) is a diagram showing an after-correction main surface shape.

Steps ST11 to ST17 were carried out in the same manner as in Example 1 to select 98 glass substrates. Then, main surface shape correction in both the scan direction (first direction) and the slit direction (second direction) was performed (ST18). With respect to the glass substrate having the after-chucking main surface shape shown in FIG. 6(b), as shown in FIG. 7(a), cross-sectional shapes of the substrate in the scan direction are respectively obtained from height information along right-end, middle, and left-end straight lines $Y_1$, each being parallel to the scan direction, in a correction region X of the after-chucking main surface shape of the mask blank substrate and, then, by calculating a quartic curve for the cross-sectional shapes at the three positions by the method of least squares, an approximate curve (first approximate curve) $Z_1$ in the scan direction is obtained as shown in FIG. 7(b). Further, as shown in FIG. 8(a), cross-sectional shapes of the substrate in the slit direction are respectively obtained from height information along upper-end, middle, and lower-end straight lines $Y_2$, each being parallel to the slit direction, in the correction region X of the after-chucking main surface shape of the mask blank substrate and, then, by calculating a quadratic curve for the cross-sectional shapes at the three positions by the method of least squares, an approximate curve (second approximate curve) $Z_2$ in the slit direction is obtained as shown in FIG. 8(b). Then, an approximate curved surface shown in FIG. 9(a) is calculated from the approximate curve (first approximate curve) $Z_1$ in the scan direction and the approximate curve (second approximate curve) $Z_2$ in the slit direction and is subtracted from the after-chucking shape obtained through simulation. A substrate shape after subtracting the approximate curved surface is shown in FIG. 9(b).

Then, a flatness in the correction region (132 mm×132 mm) of the calculated after-correction main surface was calculated and the substrate with a second threshold value (0.16 µm) or less was selected (ST19). This second threshold value was a criterion flatness required for the mask blank substrate. As a result, the number of the glass substrates satisfying this condition was 97 out of 98. If the substrate satisfying the condition of 0.16 µm, equal to the second threshold value, or less is selected based on the flatness obtained from the after-chucking main surface shape of the substrate (ST15) calculated by the conventional simulation (ST14), the number of the selected substrates is 90 out of 98. Therefore, it is seen that the production yield is largely improved by performing the main surface shape correction (ST18).

Then, on the glass substrate thus obtained, a MoSiON film (back-surface antireflection layer), a MoSi film (light-shielding layer), and a MoSiON film (antireflection layer) were formed as a thin film (light-shielding film) for transfer pattern formation, thereby manufacturing a mask blank (ST20). Specifically, using a target of Mo:Si=21:79 (at % ratio) and using Ar, $O_2$, $N_2$, and He (gas flow rate ratio Ar:$O_2$:$N_2$:He=5:4:49:42) at a sputtering gas pressure of 0.2 Pa, a film made of molybdenum, silicon, oxygen, and nitrogen (MoSiON film) was formed to a thickness of 7 nm by setting the power of the DC power supply to 3.0 kW. Then, using the same target and using Ar and He (gas flow rate ratio Ar:He=20:120) at a sputtering gas pressure of 0.3 Pa, a film made of molybdenum and silicon (MoSi film: at % ratio of Mo and Si in the film was about 21:79) was formed to a thickness of 30 nm by setting the power of the DC power supply to 2.0 kW. Then, using a target of Mo:Si=4:96 (at % ratio) and using Ar, $O_2$, $N_2$, and He (gas flow rate ratio Ar:$O_2$:$N_2$:He=6:5:11:16) at a sputtering gas pressure of 0.1 Pa, a film made of molybdenum, silicon, oxygen, and nitrogen (MoSiON film) was formed to a thickness of 15 nm by setting the power of the DC power supply to 3.0 kW. The total thickness of the thin film (light-shielding film) was set to 52 nm. The back-surface antireflection layer, the light-shielding layer, and the front-surface antireflection layer formed under these conditions had very low stress over the entire light-shielding film and thus it was possible to suppress the change in shape of the substrate to minimum.

Further, by patterning the light-shielding film of the mask blank into a predetermined pattern, a photomask (binary mask) was manufactured (ST21). The obtained photomask was verified using an exposure apparatus capable of performing main surface shape correction in the scan direction and in the slit direction. After chucking the photomask on a mask stage of the exposure apparatus and performing main surface shape correction in the scan direction and in the slit direction, the pattern of the photomask was exposed and transferred to a resist film of a semiconductor wafer W. The CD accuracy and the pattern position accuracy of the pattern transferred to the resist film were verified and it was confirmed that the photomask was sufficiently adaptable to the DRAM hp32 nm generation.

Example 4

Steps ST11 to ST17 were carried out in the same manner as in Example 1 to select 98 glass substrates and then main surface shape correction in the scan direction (first direction) was performed (ST18). Then, a flatness in a correction region (132 mm×132 mm) of a calculated after-correction main surface was calculated and the substrate with a second threshold value (0.08 µm) or less was selected (ST19). This second threshold value was a criterion flatness required for the mask blank substrate. As a result, the number of the glass substrates satisfying this condition was 92 out of 98. If the substrate satisfying the condition of 0.08 µm, equal to the second threshold value, or less is selected based on the flatness obtained from the after-chucking main surface shape of the substrate (ST15) calculated by the conventional simulation (ST14), the number of the selected substrates is 84 out of 98. Therefore, it is seen that the production yield is largely improved by performing the main surface shape correction (ST18).

Then, on the glass substrate thus obtained, a light-shielding film comprising a back-surface antireflection layer, a light-shielding layer, and a front-surface antireflection layer was formed as a thin film for transfer pattern formation in the same manner as in Example 1, thereby manufacturing a mask blank (ST20). Further, by patterning the light-shielding film of the mask blank into a predetermined pattern, a photomask (binary mask) was manufactured (ST21). The obtained photomask was verified using an exposure apparatus capable of performing main surface shape correction at least in the scan direction. After chucking the photomask on a mask stage of the exposure apparatus and performing main surface shape correction in the scan direction, the pattern of the photomask was exposed and transferred to a resist film of a semiconductor wafer W. The CD accuracy and the pattern position accuracy of the pattern transferred to the resist film were verified and it was confirmed that the photomask was sufficiently adaptable to the DRAM hp22 nm generation.

Example 5

Steps ST11 to ST17 were carried out in the same manner as in Example 2 to select 98 glass substrates and then main surface shape correction in the slit direction (second direction) was performed (ST18). Then, a flatness in a correction region (132 mm×132 mm) of a calculated after-correction main surface was calculated and the substrate with a second threshold value (0.08 μm) or less was selected (ST19). This second threshold value was a criterion flatness required for the mask blank substrate. As a result, the number of the glass substrates satisfying this condition was 91 out of 98. If the substrate satisfying the condition of 0.08 μm, equal to the second threshold value, or less is selected based on the flatness obtained from the after-chucking main surface shape of the substrate (ST15) calculated by the conventional simulation (ST14), the number of the selected substrates is 84 out of 98. Therefore, it is seen that the production yield is largely improved by performing the main surface shape correction (ST18).

Then, on the glass substrate thus obtained, a phase shift film and a light-shielding film comprising a back-surface antireflection layer, a light-shielding layer, and a front-surface antireflection layer were formed as a thin film for transfer pattern formation in the same manner as in Example 2, thereby manufacturing a mask blank (ST20). Further, by patterning the light-shielding film and the phase shift film of the mask blank into a predetermined pattern, a photomask (phase shift mask) was manufactured (ST21). The obtained photomask was verified using an exposure apparatus capable of performing main surface shape correction at least in the slit direction. After chucking the photomask on a mask stage of the exposure apparatus and performing main surface shape correction in the slit direction, the pattern of the photomask was exposed and transferred to a resist film of a semiconductor wafer W. The CD accuracy and the pattern position accuracy of the pattern transferred to the resist film were verified and it was confirmed that the photomask was sufficiently adaptable to the DRAM hp22 nm generation.

Example 6

Steps ST11 to ST17 were carried out in the same manner as in Example 3 to select 98 glass substrates and then main surface shape correction in the scan direction (first direction) and in the slit direction (second direction) was performed (ST18). Then, a flatness in a correction region (132 mm×132 mm) of a calculated after-correction main surface was calculated and the substrate with a second threshold value (0.08 μm) or less was selected (ST19). This second threshold value was a criterion flatness required for the mask blank substrate. As a result, the number of the glass substrates satisfying this condition was 93 out of 98. If the substrate satisfying the condition of 0.08 μm, equal to the second threshold value, or less is selected based on the flatness obtained from the after-chucking main surface shape of the substrate (ST15) calculated by the conventional simulation (ST14), the number of the selected substrates is 84 out of 98. Therefore, it is seen that the production yield is largely improved by performing the main surface shape correction (ST18).

Then, on the glass substrate thus obtained, a light-shielding film comprising a back-surface antireflection layer, a light-shielding layer, and a front-surface antireflection layer was formed as a thin film for transfer pattern formation in the same manner as in Example 3, thereby manufacturing a mask blank (ST20). Further, by patterning the light-shielding film of the mask blank into a predetermined pattern, a photomask (binary mask) was manufactured (ST21). The obtained photomask was verified using an exposure apparatus capable of performing main surface shape correction in both the scan direction and the slit direction. After chucking the photomask on a mask stage of the exposure apparatus and performing main surface shape correction in the scan direction and in the slit direction, the pattern of the photomask was exposed and transferred to a resist film of a semiconductor wafer W. The CD accuracy and the pattern position accuracy of the pattern transferred to the resist film were verified and it was confirmed that the photomask was sufficiently adaptable to the DRAM hp22 nm generation.

This invention is not limited to the above-mentioned embodiment and can be carried out by appropriately changing it. For example, the materials, the sizes, the processing sequences, and so on in the above-mentioned embodiment are only examples and this invention can be carried out by changing them in various ways within a range capable of exhibiting the effect of this invention. Other than that, this invention can be carried out with appropriate changes within a range not departing from the object of this invention.

This application claims priority from Japanese Patent Application No. 2009-074997, filed on Mar. 25, 2009, the disclosure of which is incorporated herein in its entirety by reference.

The invention claimed is:

1. A method of manufacturing a mask blank substrate for use in a photomask to be chucked on a mask stage of an exposure apparatus, comprising:
   a step of measuring a before-chucking main surface shape in an actual measurement region of a main surface of a substrate;
   a step of obtaining, through simulation, an after-chucking main surface shape of the substrate when the photomask manufactured from the substrate is set in the exposure apparatus, based on the before-chucking main surface shape of the substrate and a shape of the mask stage;
   a step of performing correction for the substrate by calculating a first approximate curve approximate to a cross-sectional shape along a first direction in a correction region of the after-chucking main surface shape, calculating an approximate curved surface from the first approximate curve, and subtracting the approximate curved surface from the after-chucking main surface shape, thereby calculating an after-correction main surface shape; and
   a step of selecting the substrate in which the after-correction main surface shape has a flatness of a predetermined threshold value or less in the correction region.

2. The method according to claim 1, wherein the step of calculating the after-correction main surface shape performs correction by calculating a second approximate curve approximate to a cross-sectional shape along a second direction perpendicular to the first direction, calculating an approximate curved surface from the second approximate curve, and subtracting the approximate curved surface, calculated from the second approximate curve, further from the after-chucking main surface shape having been subjected to the correction of subtracting the approximate curved surface calculated from the first approximate curve.

3. The method according to claim 2, wherein the second approximate curve is a quadratic curve or a quartic curve.

4. The method according to claim 1, wherein the first approximate curve is a quadratic curve or a quartic curve.

5. The method according to claim 1, wherein the predetermined threshold value is 0.16 μm.

6. The method according to claim 1, wherein the predetermined threshold value is 0.08 μm.

7. The method according to claim 1, wherein the actual measurement region is a region including the correction region.

8. The method according to claim 1, wherein the correction region is a 132 mm square region.

9. The method according to claim 1, comprising a step of selecting the substrate in which the before-chucking main surface shape has a flatness of 0.4 μm or less in an actual calculation region thereof.

10. The method according to claim 9, wherein the actual calculation region is a region including the correction region.

11. The method according to claim 9, wherein the actual calculation region is a 142 mm square region.

12. The method according to claim 1, wherein the exposure apparatus irradiates exposure light to the photomask through a slit which is movable in the first direction and extends in the second direction.

13. A method of manufacturing a mask blank, comprising forming a thin film on the main surface, on the side where the before-chucking main surface shape was measured, of the mask blank substrate obtained by the method according to claim 1.

14. A method of manufacturing a photomask, comprising forming a transfer pattern in the thin film of the mask blank obtained by the method according to claim 13.

15. A method of manufacturing a semiconductor device, comprising a step of chucking the photomask obtained by the method according to claim 14 on a mask stage of an exposure apparatus which is capable of performing main surface shape correction, and exposing and transferring the pattern of the photomask to a resist film of a wafer.

16. A method of manufacturing a mask blank substrate for use in a photomask to be chucked on a mask stage of an exposure apparatus, comprising:
 a step of measuring a before-chucking main surface shape in an actual measurement region of a main surface of a substrate;
 a step of obtaining, through simulation, an after-chucking main surface shape of the substrate when the photomask manufactured from the substrate is set in the exposure apparatus, based on the before-chucking main surface shape of the substrate and a shape of the mask stage;
 a step of performing correction for the substrate by calculating a first approximate curve approximate to a cross-sectional shape along a first direction in a correction region of the after-chucking main surface shape, calculating a second approximate curve approximate to a cross-sectional shape along a second direction perpendicular to the first direction, calculating an approximate curved surface from the first approximate curve and the second approximate curve, and subtracting the approximate curved surface from the after-chucking main surface shape, thereby calculating an after-correction main surface shape; and
 a step of selecting the substrate in which the after-correction main surface shape has a flatness of a predetermined threshold value or less in the correction region.

17. The method according to claim 16, wherein the first approximate curve is a quadratic curve or a quartic curve.

18. The method according to claim 16, wherein the second approximate curve is a quadratic curve or a quartic curve.

19. The method according to claim 16, wherein the predetermined threshold value is 0.16 μm.

20. The method according to claim 16, wherein the predetermined threshold value is 0.08 μm.

21. The method according to claim 16, wherein the actual measurement region is a region including the correction region.

22. The method according to claim 16, wherein the correction region is a 132 mm square region.

23. The method according to claim 16, comprising a step of selecting the substrate in which the before-chucking main surface shape has a flatness of 0.4 μm or less in an actual calculation region thereof.

24. The method according to claim 23, wherein the actual calculation region is a region including the correction region.

25. The method according to claim 23, wherein the actual calculation region is a 142 mm square region.

26. The method according to claim 16, wherein the exposure apparatus irradiates exposure light to the photomask through a slit which is movable in the first direction and extends in the second direction.

27. A method of manufacturing a mask blank, comprising forming a thin film on the main surface, on the side where the before-chucking main surface shape was measured, of the mask blank substrate obtained by the method according to claim 16.

28. A method of manufacturing a photomask, comprising forming a transfer pattern in the thin film of the mask blank obtained by the method according to claim 27.

29. A method of manufacturing a semiconductor device, comprising a step of chucking the photomask obtained by the method according to claim 28 on a mask stage of an exposure apparatus which is capable of performing main surface shape correction, and exposing and transferring the pattern of the photomask to a resist film of a wafer.

* * * * *